(12) United States Patent
Aida et al.

(10) Patent No.: US 6,972,460 B2
(45) Date of Patent: Dec. 6, 2005

(54) SEMICONDUCTOR DEVICE AND MANUFACTURING METHOD THEREOF

(75) Inventors: Satoshi Aida, Kanagawa (JP); Shigeo Kouzuki, Kanagawa (JP); Masaru Izumisawa, Kanagawa (JP); Hironori Yoshioka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 79 days.

(21) Appl. No.: 10/680,210

(22) Filed: Oct. 8, 2003

(65) Prior Publication Data

US 2004/0251516 A1    Dec. 16, 2004

(30) Foreign Application Priority Data

Jun. 11, 2003   (JP)   .............................. 2003-166353

(51) Int. Cl.$^7$ .................. H01L 29/76; H01L 29/94; H01L 31/062; H01L 31/113; H01L 31/119
(52) U.S. Cl. ............... 257/341; 257/339; 257/342; 257/370; 257/378; 257/401; 257/409; 257/488; 257/E29.012; 257/E29.256
(58) Field of Search ............... 257/341–342, 257/E29.012, E29.256, 339, 370, 378, 401, 257/409, 488, E29.021

(56) References Cited

U.S. PATENT DOCUMENTS

| | | | | |
|---|---|---|---|---|
| 5,612,564 A | * | 3/1997 | Fujishima et al. | 257/341 |
| 5,877,529 A | * | 3/1999 | So et al. | 257/341 |
| 6,104,060 A | * | 8/2000 | Hshieh et al. | 257/329 |
| 6,404,025 B1 | * | 6/2002 | Hshieh et al. | 257/409 |
| 6,621,122 B2 | * | 9/2003 | Qu | 257/399 |
| 6,664,590 B2 | * | 12/2003 | Deboy | 257/328 |
| 6,674,126 B2 | * | 1/2004 | Iwamoto et al. | 257/341 |
| 6,747,315 B1 | * | 6/2004 | Sakamoto | 257/341 |
| 6,803,629 B2 | * | 10/2004 | Tihanyi | 257/342 |
| 2002/0024056 A1 | * | 2/2002 | Miyakoshi et al. | 257/144 |
| 2002/0117732 A1 | * | 8/2002 | Letor et al. | 257/577 |
| 2003/0047778 A1 | * | 3/2003 | Nakamura et al. | 257/330 |
| 2003/0178672 A1 | * | 9/2003 | Hatakeyama et al. | 257/328 |
| 2003/0178676 A1 | * | 9/2003 | Henninger et al. | 257/340 |

FOREIGN PATENT DOCUMENTS

| | | |
|---|---|---|
| JP | 6-275632 | 9/1994 |
| JP | 7-86565 | 3/1995 |
| JP | 2000-183337 | 6/2000 |

* cited by examiner

Primary Examiner—Michael Trinh
Assistant Examiner—Ida M. Soward
(74) Attorney, Agent, or Firm—Oblon, Spivak, McClelland, Maier & Neustadt, P.C.

(57) ABSTRACT

A semiconductor device including a drift layer of a first conductivity type formed on a surface of a semiconductor substrate. A surface of the drift layer has a second area positioned on an outer periphery of a first area. A cell portion formed in the first area includes a first base layer of a second conductivity type, a source layer and a control electrode formed in the first base layer and the source layer. The device also includes a terminating portion formed in the drift layer including a second base layer of a second conductivity type, an impurity diffused layer of a second conductivity type, and a metallic compound whose end surface on the terminating portion side is positioned on the cell portion side away from the end surface of the impurity diffused layer on the terminal portion side.

24 Claims, 14 Drawing Sheets

SEMICONDUCTOR DEVICE AND MANUFACTURING METHOD THEREOF

CROSS REFERENCE TO RELATED APPLICATION

This application claims benefit of priority under 35USC §119 to Japanese patent application No. 2003-166353, filed on Jun. 11, 2003, the contents of which are incorporated by reference herein.

BACKGROUND OF THE INVENTION

1. Field of the Invention

The present invention relates to a semiconductor device and a manufacturing method thereof, and more particularly to an improvement in a structure of a terminating portion of, e.g., a high-voltage vertical MOSFET (Metal Oxide Semiconductor Field Effect Transistor) or an IGBT (Insulated Gate Bipolar Transistor) with a high breakdown voltage, which is applied with, e.g., a high frequency voltage.

2. Related Background Art

A structure of a vertical MOSFET is adopted in a power device such as a power MOSFET or IGBT. In particular, the power MOSFET is a key device essential to realization of a high efficiency of a switching power supply which is extensively used in information devices, portable devices or electronic devices. It is effective to increase an operating frequency in order to improve the efficiency of the switching power supply, and performances required in the power MOSFET have been changed from the conventional low-ON resistance orientation to the low-parasitic-capacitance orientation. As to a loss in the power MOSFET, when the operating current is large and the operating frequency is high, the switching loss becomes dominant. A fall time (tf) dominates the switching loss. In order to shorten this fall time and reduce the switching loss, it is important to reduce Qsw which is an electric charge quantity required to charge the parasitic capacitance of the power MOSFET and rg which is a gate internal resistance.

FIG. 21 is a cross-sectional view showing an example of a conventional MOSFET. The MOSFET shown in the drawing is called a planar type MOSFET because of its gate structure. In the conventional planar type MOSFET, polysilicon obtained by doping an impurity with a high concentration is used as a material of its gate electrode 106. Its impurity concentration is approximately 1E19 to 1E20 cm$^{-3}$ and its resistivity is 400 to 500 $\mu\Omega$·cm. In order to reduce the parasitic capacitance of the planar type MOSFET, the planar dimension of a gate electrode must be reduced, which is carried out by extremely narrowing a width of the gate polysilicon of a unit MOSFET which is usually called a cell. In this realization of fineness, however, there is a relationship of a so-called trade-off that a reduction in cross section area of a gate electrode increases the gate internal resistance rg.

As a method of overcoming this trade-off, there has been conventionally a salicide (silicide) technology used in a general IC (Integrated Circuit) or the like. In this technology an insulating film called a side wall spacer is provided on a side wall of the gate polysilicon and the resistance of a surface of a gate polysilicon electrode is lowered by forming a metallic compound of silicon and a metal such as titanium (Ti) or cobalt (Co). Using this technology both a reduction in capacitance and a reduction in resistance can be achieved through realization of fineness. Further, a metallic compound can be simultaneously formed on a surface of a source layer while avoiding a short-circuit with an adjacent source layer by using the side wall spacer, thereby advantageously reducing its wiring resistance. This technology is known technology in the field of IC, and by applying this technology to the power MOSFET, both a reduction in capacity and a reduction in resistance of a gate can be achieved, thus it seems that the original problem can be solved. Such an application of the salicide technology to the power MOSFET has been already disclosed in, e.g., Japanese Patent No. 3284992.

Meanwhile, most power devices as typified by the power MOSFET are used in products which deal with a high voltage not less than 30 V. These power devices have a cell portion in which the above-described unit MOSFET is formed as well as a terminating portion which is positioned on an outer periphery of the cell portion and used to maintain a breakdown voltage by relieving an electric field by extending a depletion layer. Since this terminating portion generally tends to have a higher electric field than that in the cell portion, a design thereof requires to take a higher electric field than that in the cell portion into consideration. Further, the reliability of the power device can be assured by existence of the terminating portion which is appropriately designed.

However, Japanese Patent No. 3284992 refers to only the cell portion, and there is no description concerning a design of the terminating portion at all.

For example, in a MOSFET shown in FIG. 21, even if a capacitance is reduced by realizing a fine width of a gate electrode 106, an internal resistance of the gate is not increased since a metal compound of, e.g., a silicide layer 116 on the gate electrode 106 has a low resistance. Comparing specific resistances of polysilicon and a typical material of silicide, e.g., TiSi2, a specific resistance of the metal compound such as silicide is considerably lower by a factor because TiSi2 has a resistance of approximately 15 $\mu\Omega$·cm, whereas polysilicon has a resistance of approximately 500 $\mu\Omega$·cm. Therefore, there is an advantage that a reduction in capacitance by realization of fineness can be promoted.

On the other hand, when applying a breakdown voltage, since a distance between channel base layers 108 is short because of realization of fineness of a gate electrode width in an area Rc of the cell portion, depletion of a drift layer 102 in this period occurs with a relatively low voltage. For example, assuming that a concentration of the drift layer 102 is 2E15 cm$^{-3}$, a concentration of the channel base layer 108 is 2E17 cm$^{-3}$ and a distance between the channel base layers 108 is 5 $\mu$m, depletion occurs with approximately 10 V. A higher voltage is rarely applied in this period, and the voltage is applied to an interface between a bottom of the channel base layer 108 and the drift layer 102. Therefore, a depletion layer extending from the side surface of the channel base layer 108 to the inside is very short.

In the area Rt of the terminating portion, however, as different from the area Rc of the cell portion, since there is no adjacent base layer on the outer side of the base layer 140, a voltage according to its breakdown voltage is necessarily applied. Therefore, a width of the depletion layer extending from the outer side surface of the base layer 140 toward the inside in the terminating portion Rt is longer than a width in the cell portion. In a regular process, there are electric charges on an interface between an oxide film 104 and the drift layer 102, since the base layer 140 in the terminating portion Rt is a P type layer in a case of an N channel type MOSFET in particular, its surface concentration tends to lower. Accordingly, the depletion layer is further apt to extend toward the surface layer of the base layer 140 in the terminating portion. As shown in FIG. 21, when a metallic compound 144 is formed in such a manner that an outer end portion of the metallic compound 144 is positioned on the outer side away from a high-concentration impurity diffused layer 142, there is possibility that the depletion layer extending from the outer side surface of the base layer 140 to its inside may reach the metallic compound 144 such as a silicide layer through the base layer 140. If such a situation occurs, a leak current flows and the breakdown voltage is lowered. The advantage of providing the high-concentration impurity diffused layer 142 cannot be obtained. It is to be noted that a dotted line Pmp shown in FIG. 21 indicates a patterning position of a mask formed in the terminating portion used to form the high-concentration impurity diffused layer 142.

In order to suppress extension of the depletion layer in the terminating portion Rt to the inside of the base layer 140 and maintain the high reliability of the device, as indicated by a broken line circle C in FIG. 22, there is required, e.g., the high-concentration impurity diffused layer 143IM of the same conductivity type as that in the base layer 140, which is formed in the surface layer of the base layer 140 in the terminating portion Rt so as to extend to the outer side away from the metallic compound 144 such as the silicide layer.

Here, since a field plate electrode 202 is formed above the drift layer 102 with the gate oxide film 104 therebetween, patterning must be executed on the further outer side of an outer boundary of a formation plan area of the high-concentration impurity diffused layer 143IM (see the broken line $P_{IMP}$ in FIG. 22), considering a mask matching margin. However, since the high-concentration impurity diffused layer 143IM is usually formed by an ion implantation technique, when patterning of the field plate electrode 202 is carried out at such a position, the gate oxide film 104 is exposed to danger that a dielectric breakdown might occur due to a charge-up at the time of ion implantation.

As described above, in the conventional structure, it is difficult to achieve both stabilization of a breakdown voltage without increasing a process load and a reduction in resistance of the gate electrode.

BRIEF SUMMARY OF THE INVENTION

According to a first aspect of the present invention, there is provided a semiconductor device comprising:

a semiconductor substrate of a first conductivity type;

a drift layer of a first conductivity type formed on a first main surface of the semiconductor substrate, a surface of the drift layer having a first area and a second area which is positioned on an outer periphery of the first area;

a cell portion which is formed in the first area of the drift layer and includes a first base layer of a second conductivity type selectively formed in a surface layer of the first area, a source layer of a first conductivity type selectively formed in a surface layer of the first base layer, a first metallic compound which is formed on the surface layer of the first base layer and a surface layer of the source layer in common, and a control electrode which is formed in the first base layer and the source layer via a first insulating film and has a second metallic compound formed on a top surface thereof;

a terminating portion which is formed in the second area of the drift layer, alleviates an electric field to maintain a breakdown voltage by extending a depletion layer, and includes a second base layer of a second conductivity type selectively formed in a surface layer in the second area of the drift layer, an impurity diffused layer of a second conductivity type formed in a surface layer of the second base layer, and a third metallic compound which is provided to a surface layer of the impurity diffused layer, an end surface thereof on the terminating portion side being positioned on the cell portion side away from an end surface of the impurity diffused layer on the terminating portion side;

a first main electrode formed so as to be in contact with the first metallic compound and the third metallic compound in common; and a second main electrode formed on a second main surface opposite to the first main surface of the semiconductor substrate.

According to a second aspect of the present invention, there is provided a semiconductor device comprising:

a semiconductor substrate of a first conductivity type;

a drift layer of a first conductivity type formed on a first main surface of the semiconductor substrate and has a first area and a second area which is positioned on an outer periphery of the first area;

a cell portion which is formed in the first area of the drift layer, and includes a first base layer of a second conductivity type selectively formed in a surface layer of the first area, a trench formed so as to extend from a surface of the first base layer to the inside of the drift layer, a first insulating film formed on a bottom surface and side surfaces of the trench, a source layer of a first conductivity type selectively formed in a surface layer of the first base layer so as to be in contact with the first insulating film, a first metallic compound formed on a surface of the first base layer and a surface of the source layer in common, and a control electrode which is formed so as to fill the trench via the first insulating film and has a second metallic compound formed on a top face thereof;

a terminating portion which is formed in the second area of the drift layer and alleviates an electric field to maintain a breakdown voltage by extending a depletion layer, and includes a second base layer of a second conductivity type selectively formed in a surface layer in the second area of the drift layer, an impurity diffused layer of a second conductivity type formed in a surface layer of the second base layer, and a third metallic compound which is formed in a surface layer in the impurity diffused layer, an end surface thereof on the terminating portion side being positioned on the cell portion side away from an end surface of the impurity diffused layer on the terminating portion side;

a first main electrode formed so as to be in contact with the first metallic compound and the third metallic compound in common; and a second main electrode formed on a second main surface opposite to the first main surface of the semiconductor substrate.

According to a third aspect of the present invention, there is provided a manufacturing method of a semiconductor device comprising:

forming a drift layer of a first conductivity on a first main surface of a semiconductor substrate of a first conductivity type, a surface of the drift layer having a first area for a cell portion and a second area for a terminating portion which is positioned on an outer periphery of the first area and alleviates an electric field to maintain a breakdown voltage by extending a depletion layer;

forming a first insulating film with a first thickness in the second area on the drift layer;

forming a second insulating film having a second thickness smaller than the first thickness in the first area on the drift layer;

forming a control electrode by depositing an electrode material on the second insulting film and patterning it;

forming a first base layer in the first area and a second base layer in the second area by implanting a second conductivity impurity into the drift layer using the control electrode and the first insulating film as a mask and then by a heat treatment to diffuse it;

selectively forming an impurity diffusion layer in a surface layer of the second base layer by implanting a second conductivity impurity into the second base layer by using a resist formed on the control electrode and the first insulating film as a mask and then by a heat treatment to diffuse it;

selectively forming a source layer of a first conductivity type in a surface layer of the first base layer; and forming a first metallic compound and a second metallic compound in surface layers of the source layer and of the control electrode, respectively, by depositing a metallic material on the source layer, the control electrode and the impurity diffused layer, causing the source layer, the control electrode, the impurity diffused layer to react with the metallic material by a heat treatment, and then selectively removing the metallic material, and forming a third metallic compound in a surface layer of the impurity diffused layer so that an end surface thereof on the terminating portion side is positioned on the cell portion side away from an end portion of the impurity diffused layer on the terminating portion side.

According to a fourth aspect of the present invention, there is provided a manufacturing method of a semiconductor device comprising:

forming a drift layer of a first conductivity type on a first main surface of a semiconductor substrate of a first conductivity type, a surface of the drift layer having a first area for a cell portion and a second area for a terminating portion which is positioned on an outer periphery of the first area and alleviates an electric field to maintain a breakdown voltage by extending a depletion layer;

forming a first insulating film with a first thickness in the second area on the drift layer;

forming a base layer by implanting a second conductivity type impurity into the drift layer and then diffusing it by a heat treatment;

selectively forming an impurity diffused layer in a surface layer of the base layer in the second area by implanting a second conductivity type impurity into the base layer by using a resist and then diffusing it by a heat treatment;

selectively forming a source layer of a first conductivity type in a surface layer of the base layer in the first area;

forming a trench which reaches the drift layer from a surface of the source layer through the base layer and forming a second insulating film on a bottom surface and side surfaces of the trench;

forming a control electrode by filling the trench via the second insulating film with an electrode material; and forming a first metallic compound and a second metallic compound to surface layers of the source layer and of the control electrode, respectively, by depositing a metallic material on the source layer, the control electrode and the impurity diffused layer, causing the source layer, the control electrode and the impurity diffused layer to react with the metallic material by a heat treatment and then selectively removing the metallic material, and forming a third metallic compound to a surface layer of the impurity diffused layer in such a manner that an end surface thereof on the terminating portion side is positioned on the cell portion side away from an end surface of the impurity diffused layer on the terminating portion side.

DETAILED DESCRIPTION OF THE INVENTION

Some embodiments according to the present invention will be described hereinafter with reference to the accompanying drawings.

Figure 1:
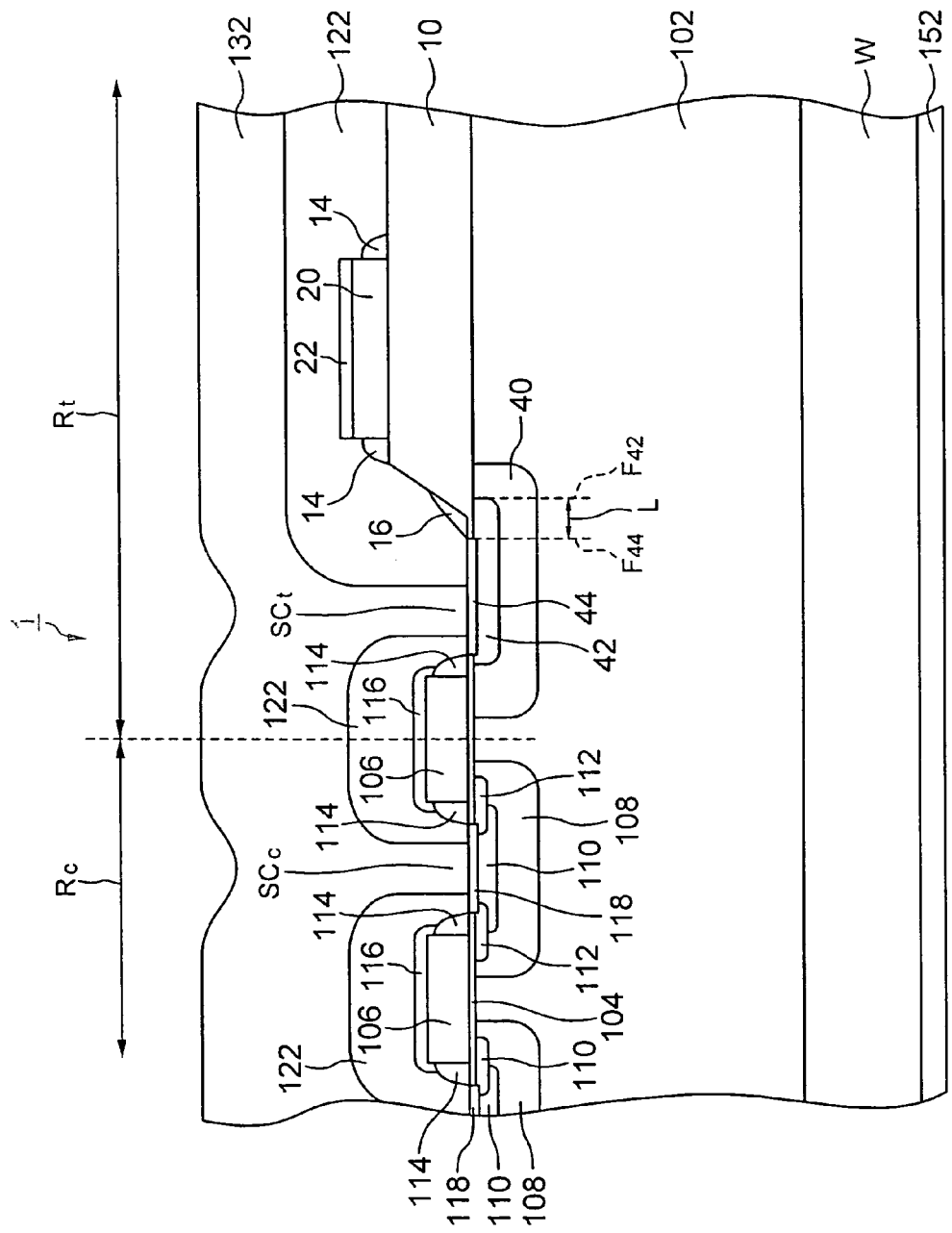
FIG. 1 is a schematic cross-sectional view showing a primary part of a first embodiment of a semiconductor device according to the present invention.

FIG. 1 is a schematic cross-sectional view showing a primary part of a first embodiment of a semiconductor device according to the present invention. A characteristic of a vertical planar type power MOSFET 1 shown in the drawing lies in a breakdown voltage structure in a terminating portion. The structure of the power MOSFET 1 will be described in more detail hereinafter.

The power MOSFET 1 comprises: a semiconductor substrate W of a first conductivity type; a drain electrode 152 formed on one surface of the semiconductor substrate W; and a drift layer 102 which is formed of a material of the first conductivity type on the other surface of the semiconductor substrate W by epitaxial growth or the like and has an area Rc for a cell portion and an area Rt for a terminating portion.

The cell portion includes: a gate electrode 106 formed of a material such as polysilicon on the drift layer 102 via a gate oxide film 104; a channel base layer 108 (which will be hereinafter referred to as a cell base layer 108) formed by implantation of impurity ions of a second conductivity type which is opposite to the first conductivity type by using the gate electrode 106 and the like as a mask and thermodiffusion; a source layer 112 selectively formed with a material of the second conductivity type in a surface layer of the cell base layer 108; and a first high-concentration impurity diffused layer 110 formed with a material of the second conductivity type in a surface layer of the cell base layer 108 so as to be sandwiched by the source layers 112. The gate electrode 106 is electrically insulated from the source electrode 132 by a side wall spacer 114. Further, metal silicide layers 116 and 118 made of compounds with a metal are respectively formed on a surface of the gate electrode 106, a surface of the high-concentration impurity diffused layer 110 and a surface of the source layer 112. The metal silicide layer 118 is in contact with the source electrode 132 by a cell portion source contact SCc. It is to be noted that the metal silicide layer 116 is formed so as to extend to an upper surface of the side wall spacer 114 from the surface of the gate electrode 106 in this embodiment.

On the other hand, the terminating portion includes: an oxide film 10 formed on the drift layer 102 so as to define the area Rt for the terminating portion; a second base layer (which will be hereinafter referred to as a terminating portion base layer) 40 formed in a surface layer of the drift layer 102; and a field plate electrode 20 formed on a surface of the oxide film 10 to stabilize a breakdown voltage. The oxide film 10 is directly formed on the drift layer 102 without interposing the oxide film 104. A side wall spacer 16 is further formed on a bottom portion of the oxide film 10 in the cell portion side and in the vicinity thereof. The field plate electrode 20 is formed simultaneously with the gate electrode 106, a metal silicide layer 22 made of a compound with a metal such as a silicide is provided on the surface of the field plate electrode 20 like the gate electrode 106, and a side wall spacer 14 is formed on side surfaces of the field plate electrode 20 like the side wall spacer 114. The field plate electrode 20 is fixed to the same potential as that of either the gate electrode 106 or the source electrode 132.

The terminating portion base layer 40 is formed by implanting the second conductivity type impurity ions into the drift layer 102 using the end portion of the oxide film 10 on the cell side as a mask and thereafter performing thermodiffusion processing. A second high-concentration impurity diffused layer of a second conductivity type (which will be hereinafter referred to as a terminating portion high-concentration impurity diffused layer) 42 is selectively formed in a surface layer of the terminating portion base layer 40. Furthermore, a metal silicide layer 44 made of a compound with a metal such as silicide is selectively formed on a surface of the second conductivity type high-concentration area 42. The metal silicide layer 44 is formed in the self-alignment manner by using the side wall spacer 114 of the gate electrode 106 on the cell portion side as a mask and using the side wall spacer 16 of the oxide film 10 on the side of the terminating portion as a mask, and is formed so that its side surface F44 on the terminating portion side is positioned away from the side surface F42 of the terminating portion high-concentration impurity diffused layer 42 on the terminating portion side. A distance L between the side surface F44 of the metal silicide layer 44 and the side surface F42 of the terminating portion high-concentration impurity diffused layer 42 is assured by a diffusion depth of the terminating portion high-concentration impurity diffused layer 42 in a lateral direction and a width of the side wall spacer 16. For example, assuming that the first conductivity type is an N type, the second conductivity type is a P type, an acceptor concentration NA of the terminating portion base layer $40=1E17$ cm$^{-3}$, a donor concentration ND of the drift layer $102=1E14$ cm$^{-3}$ and an application voltage V=1,000 V, a width of a full depletion layer is approximately 110 μm. Since the depletion layer then extends toward the P and N in inverse proportion to the impurity concentration, the depletion layer extends toward the inside of the terminating portion base layer 40 by approximately 0.1 μm which is approximately 1/1000 of 110 μm. Therefore, L≧=approximately 0.2 μm is desirable as the distance L between the side surface F44 and the side surface F42. The terminating portion base layer 40 is connected to the source electrode 132 via the terminating portion high-concentration impurity diffused layer 42, the metal silicide layer 44 and a terminating portion contact SCt.

Figure 2:
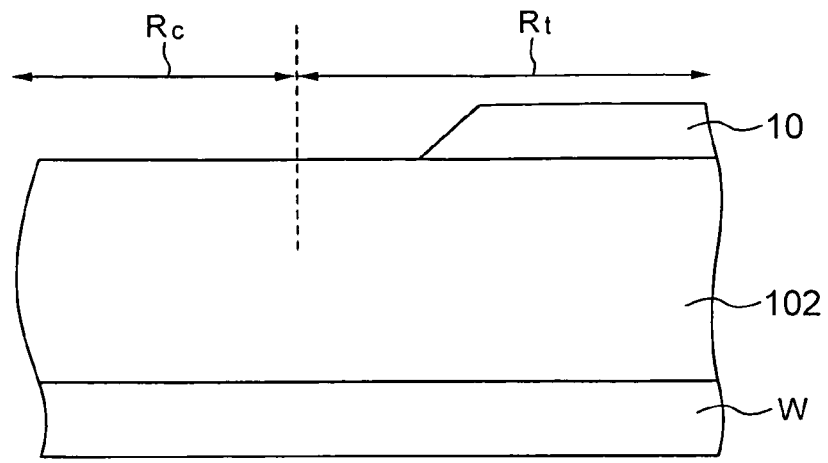
FIGS. 2 through 8 are schematic cross-sectional views showing a manufacturing method of the semiconductor device illustrated in FIG. 1.
Figure 3:
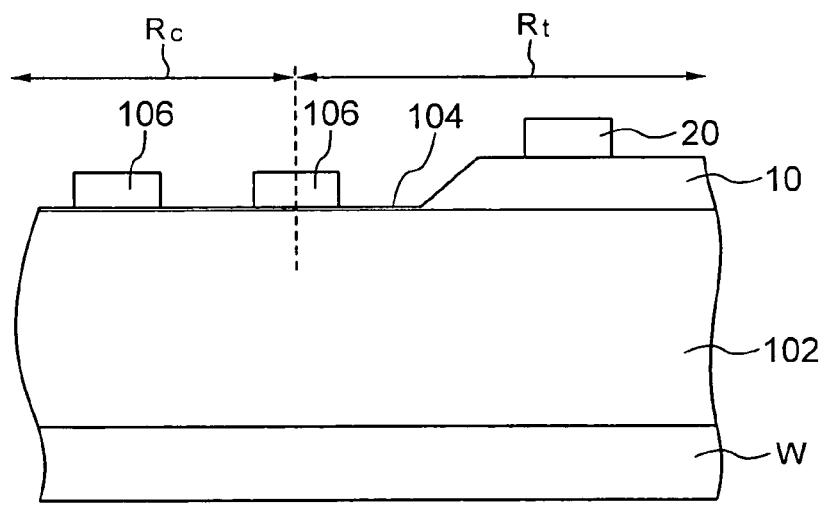
Figure 4:
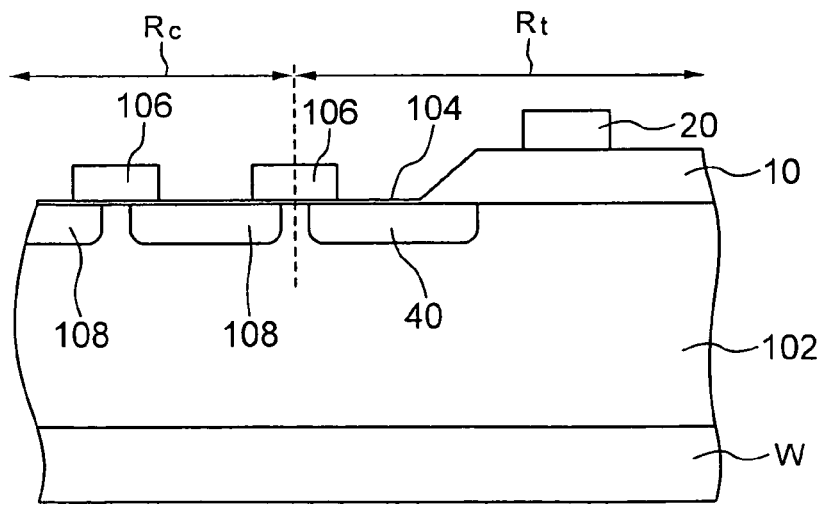
Figure 5:
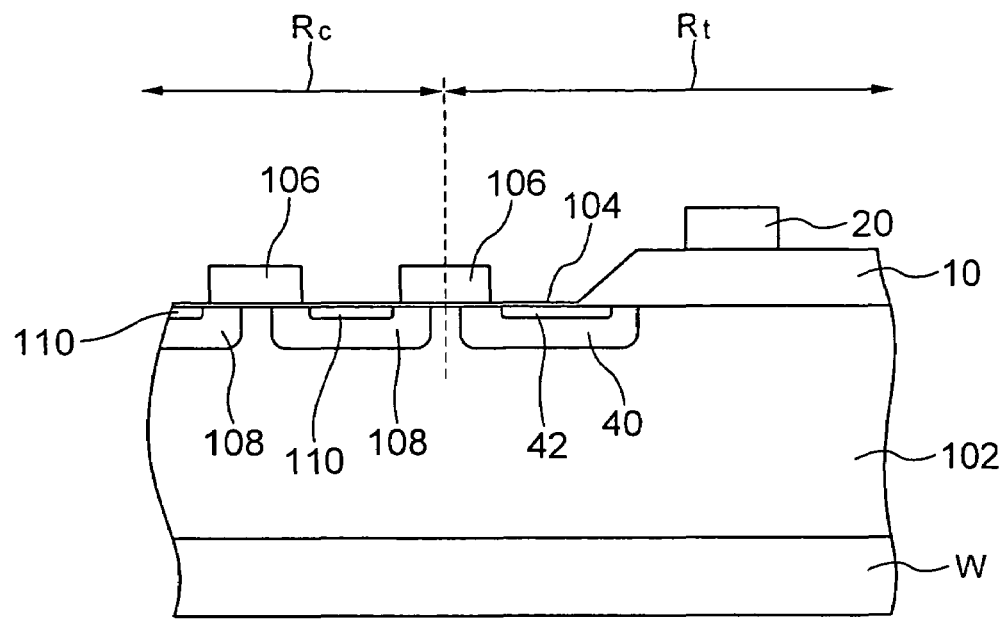
Figure 6:
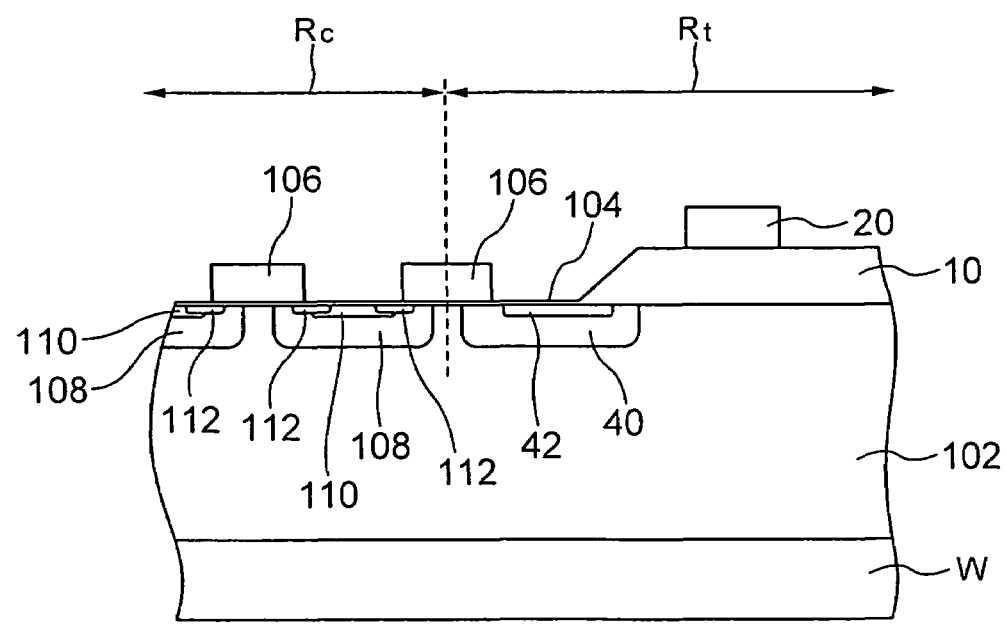
Figure 7:
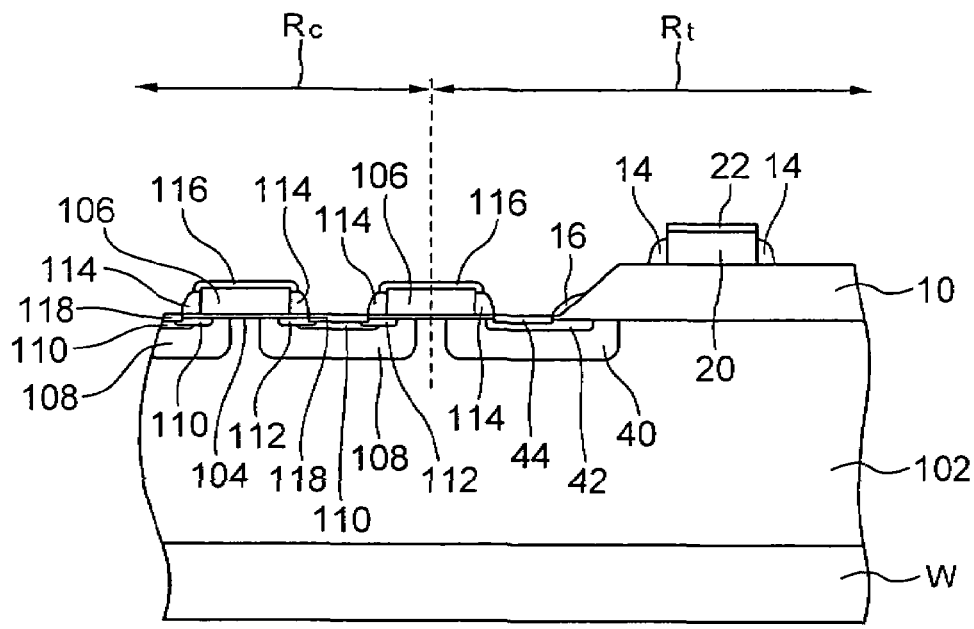
Figure 8:
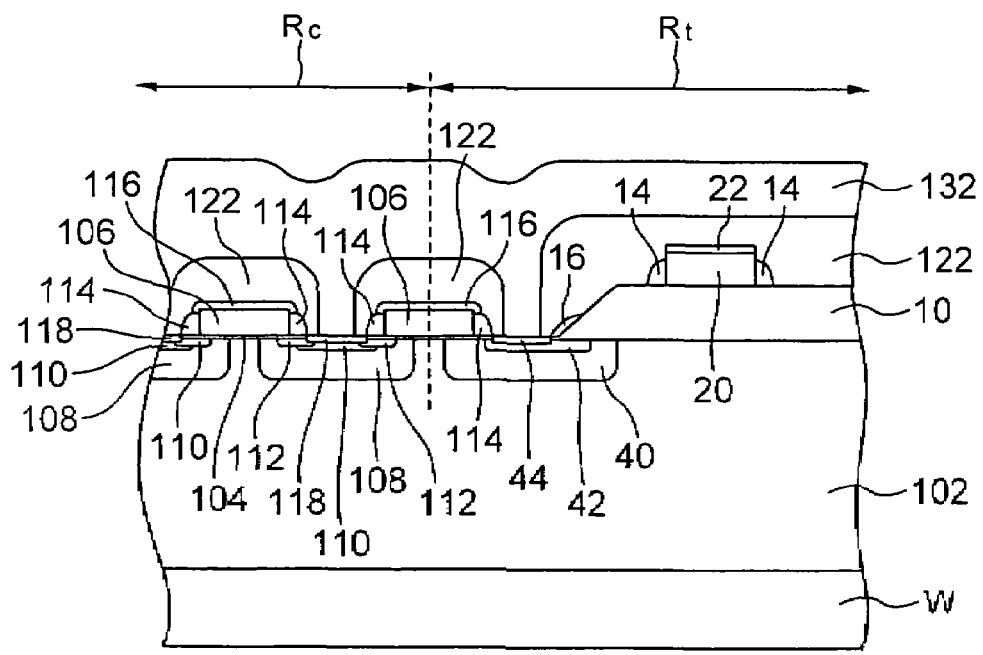

A manufacturing method of the vertical planar type MOSFET 1 shown in FIG. 1 will be described with reference to cross-sectional views of FIGS. 2 through 8. First, as shown in FIG. 2, the drift layer 102 of the first conductivity type is formed by epitaxial growth and the like on the semiconductor substrate W which is to be a drain layer. Then, the oxide film 10 is formed on the drift layer 102 by using a thermal oxidation technique or the like. Subsequently, the cell portion Rc and a part of the terminating portion Rt of the MOSFET are selectively etched and removed from the oxide film 10 by using a photolithography technique and the like. In this embodiment, since removal is carried out by wet type etching, an end portion of the oxide film 10 on the side of the cell portion has a tapered shape, and a gentle inclined surface remains. Subsequently, the gate oxide film 104 is formed on the surface of the drift layer 102 by using the thermal oxidation technique or the like, and polysilicon is grown on the gate oxide film 104 by using a CVD technique or the like. Then, as shown in FIG. 3, polysilicon on the gate oxide film 104 is selectively eliminated by patterning and etching using the photolithography technique and the like so as to leave an area for the gate 106 of the MOSFET and an area for the field plate electrode 20. Then, the second conductivity type impurity ions are implanted into the drift layer 102 using the polysilicon 106 and 20 as masks, and then the cell portion base layer 108 and the terminating portion base layer 40 are formed by thermodiffusion processing and the like as shown in FIG. 4. Thereafter, as shown in FIG. 5, the high-concentration impurity diffused layers 110 and 42 of the second conductivity are selectively formed in the cell portion base layer 108 and in the terminating portion base layer 40, respectively, by the photolithography technique, the impurity ion implantation, the thermodiffusion processing and others. Here, the mask of the terminating portion high-concentration impurity diffused layer 42 is formed so as to be positioned on the inner side away from the field plate electrode 20 and on the outer side area from a formation plan area of the later-described side wall spacer 16 (see FIG. 8). At this time, it is desirable to perform patterning in an inner area away from the field plate electrode 20 on the oxide film 10. Furthermore, as shown in FIG. 6, the source layer 112 is selectively formed in a surface layer of the cell portion base layer 108 by using a known technique. Then, as shown in FIG. 7, an insulating film is deposited on the surface by using the CVD technique, and the side wall spacers 114, 16 and 14 are formed by utilizing a step between the gate electrode 106 and the substrate surface by anisotropic etching. Subsequently, a high-melting point metal such as titanium (Ti) is deposited on the surface by a sputtering technique and the like, and the high-melting point metal is caused to react with the gate electrode polysilicon 106, the field plate electrode 20 and the substrate surface silicon by a heat treatment, thereby forming the metal silicide layers 116, 118, 44 and 22. The metal which does not react with silicon is selectively removed by subsequent etching. Then, as shown in FIG. 8, an interlayer insulating film 122 which insulates the gates and the sources from each other is formed by the CVD technique or the like, this insulating film is selectively eliminated by etching utilizing the photolithograph technique, and a contact hole for the source electrode is formed. Subsequently, a metal having, e.g., aluminium (Al) as a main component is deposited by a sputtering technique and the like, this is selectively removed by etching utilizing the photolithography technique or the like, and the gate electrode 106 and the source electrode 132 are lead out to the outside (not shown). At last, a drain electrode 152 is formed on the lower side of the semiconductor substrate W. With the above-described steps, the power MOSFET 1 of the first embodiment of the semiconductor device according to the present invention can be manufactured. Since the terminating portion thus formed has the high-concentration impurity layer 42 on the outer side of the metal suicide layer 44, the high reliability can be assured even if a high breakdown voltage is used.

As described above, according to this embodiment, there is provided the vertical planar type MOSFET 1 which can simultaneously realize a reduction in resistance of the gate electrode and stabilization of the breakdown voltage in the terminating portion.

Figure 9:
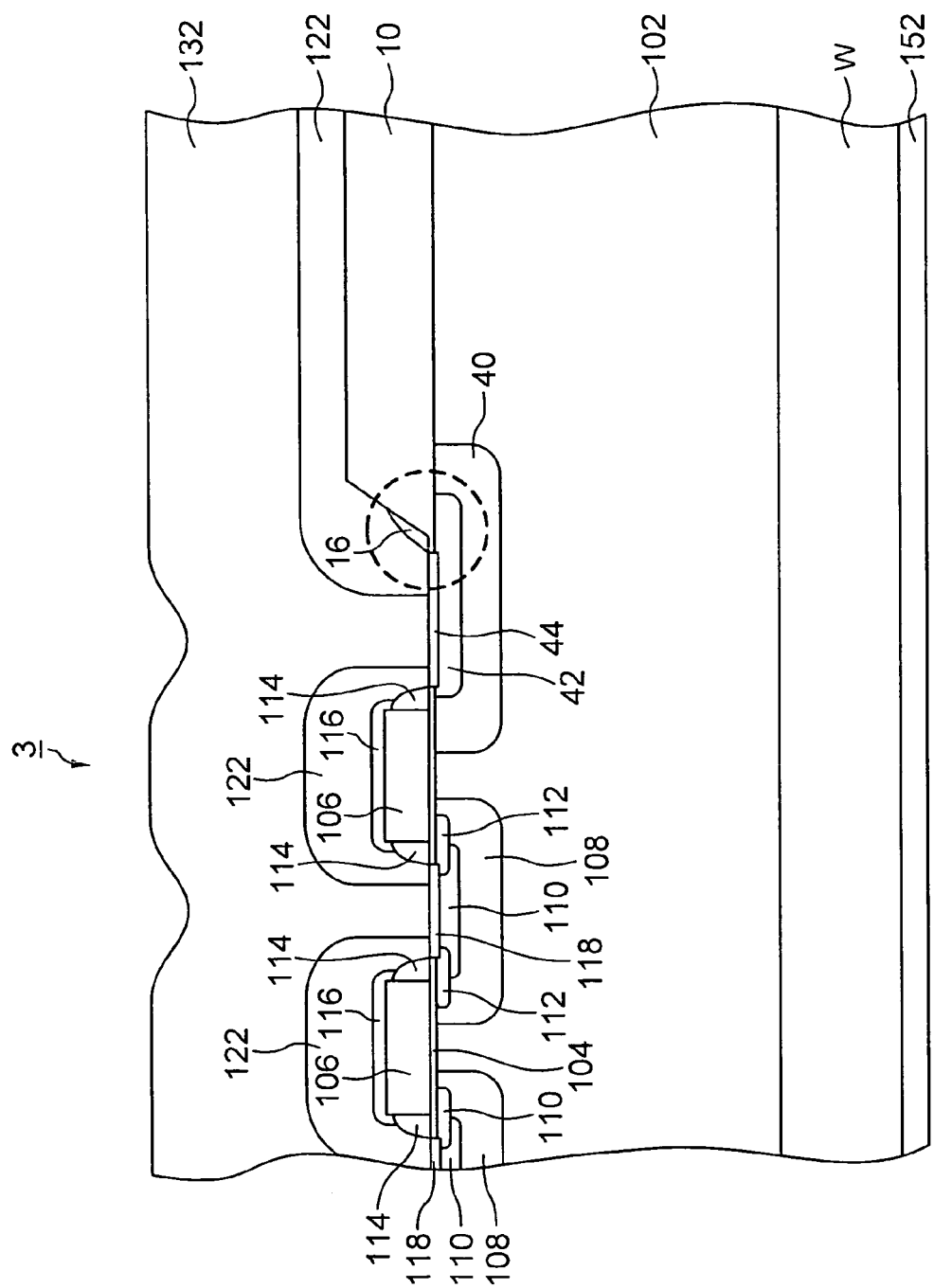
FIG. 9 is a schematic cross-sectional view showing a primary part of a second embodiment of the semiconductor device according to the present invention.
Figure 10:
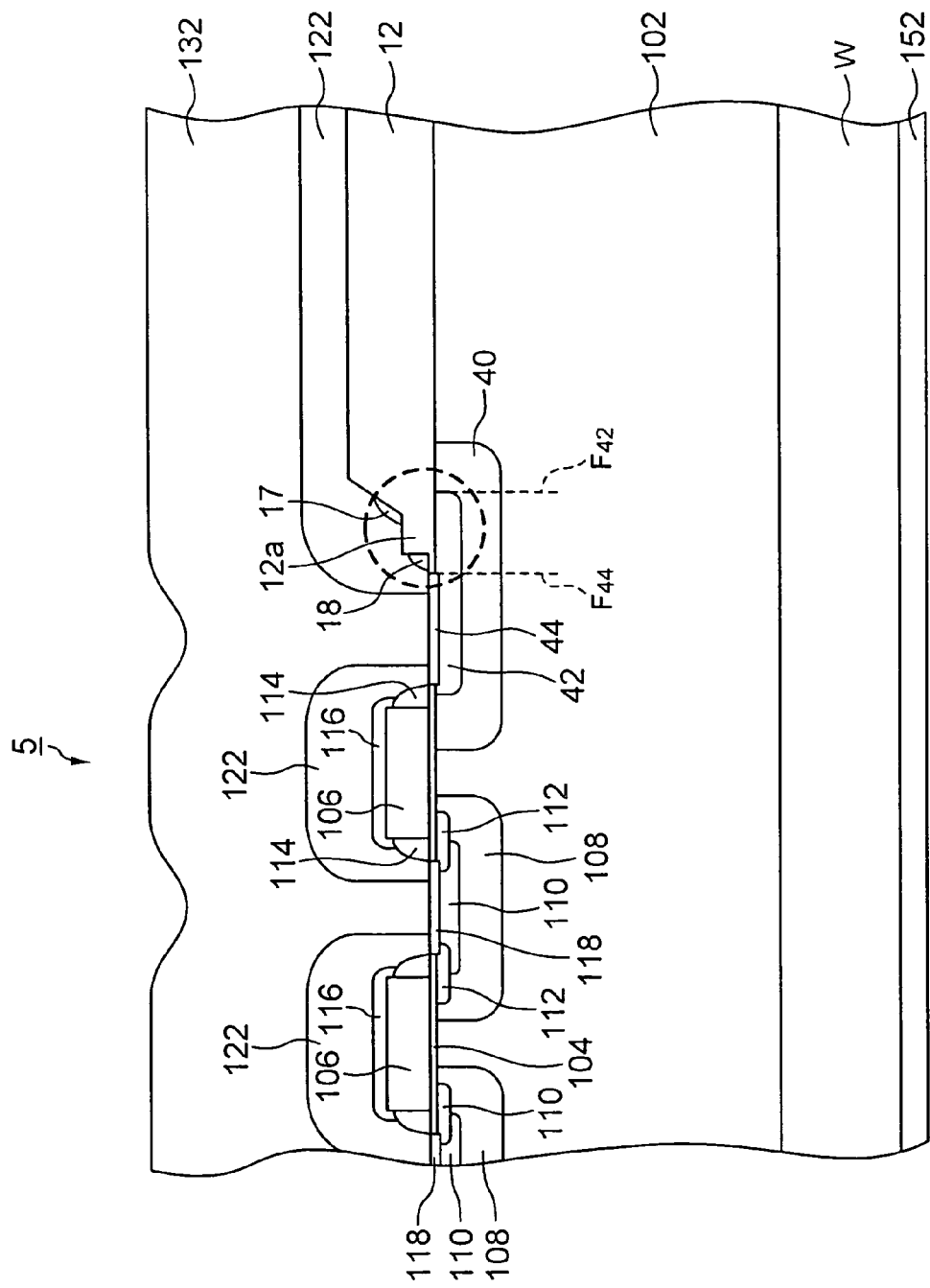
FIG. 10 is a schematic cross-sectional view showing a primary part of a third element of the semiconductor device according to the present invention.

Like the power MOSFETs 3 and 5 respectively shown in FIGS. 9 and 10, the terminating portion may have a structure in which no field plate electrode 20 is provided. In this case, in order to assure the breakdown voltage stability, it is desirable to form an external electrode with a metal including, e.g., aluminium (Al) as a main component in place of the field plate electrode 20. Other characteristic of the power MOSFET 5 shown in FIG. 10 lie in that an end portion of the oxide film 12 on the cell portion side is constituted by a tapered part having a gentle inclined surface and a thin-film part 12*a* which is continuously formed on the bottom of the tapered part on the cell portion side. The thin-film part 12*a* has such a film thickness that the impurity ions punch through the thin-film part 12*a* at the time of ion implantation for forming the terminating portion high-concentration impurity layer 42. As a result, it is possible to further stably assure the distance between the outer end surface F44 of the finally formed metal silicide layer 44 and the outer side surface F42 of the high-concentration impurity layer of the second conductivity type. As a result, the power MOSFET with the further stable breakdown voltage is provided.

Figure 11:
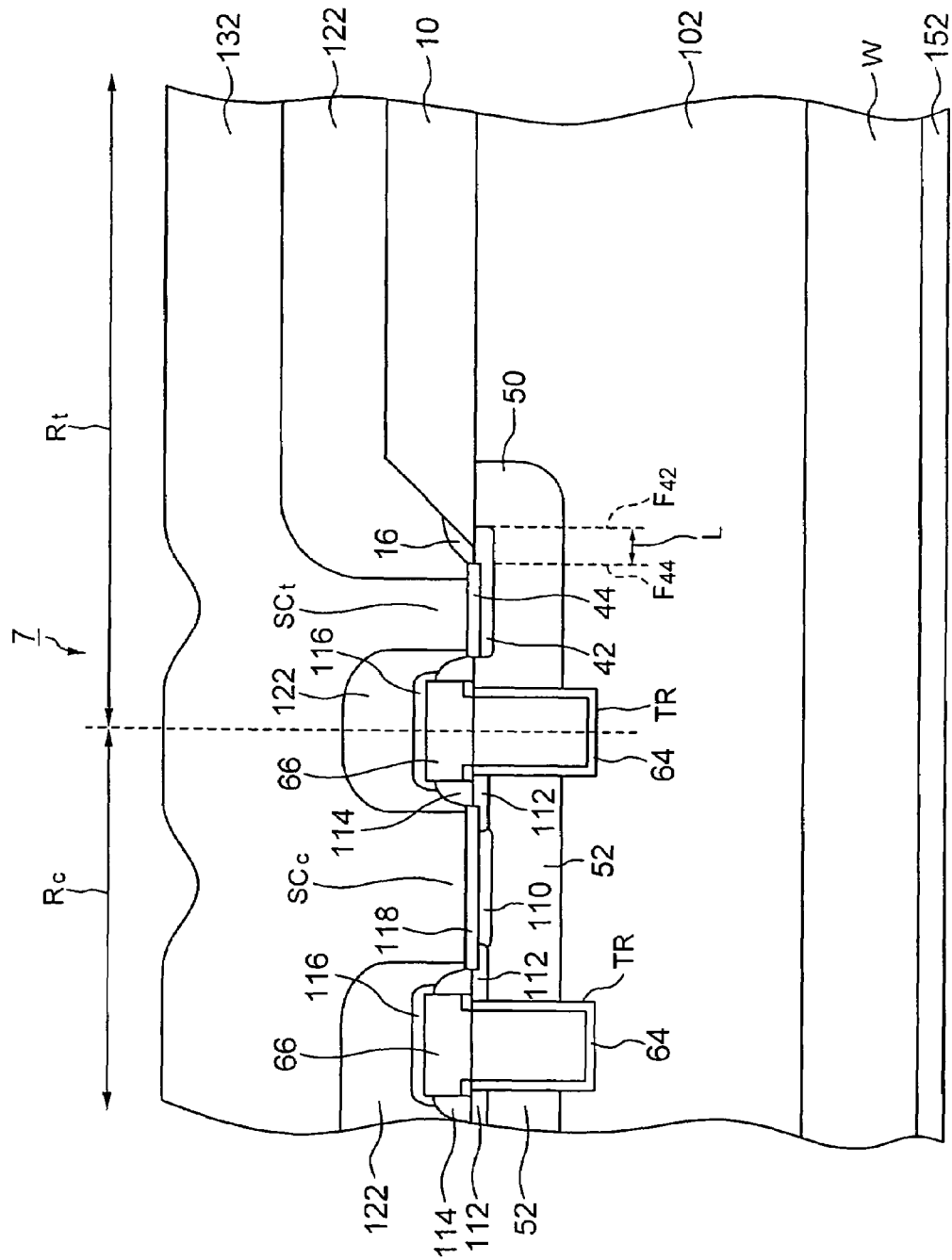
FIG. 11 is a schematic cross-sectional view showing a primary part of a fourth embodiment of the semiconductor device according to the present invention.

FIG. 11 is a schematic cross-sectional view showing a primary part of a fourth embodiment of the semiconductor device according to the present invention. The power MOSFET 7 shown in the drawing is obtained by applying the breakdown voltage structure of the terminating portion in the first embodiment to a terminating portion of a trench gate type power MOSFET. A trench TR is formed in the cell portion Rc of the power MOSFET 7 so as to extend from the source layer 112 to the inside of the drift layer 102 through the cell portion base layer 52, and the gate electrode 66 is formed so as to be sandwiched between the gate oxide films 64 formed on the bottom surface and the side surfaces of the trench TR. Side walls 114 are formed on the side surface of the gate electrode 66, and this side wall 114 and the interlayer insulating film 122 electrically insulate the gate electrode 66 from the source electrode 132. Moreover, like the first to third embodiments, the metal silicide layer 116 is formed on the upper surface of the gate electrode 66 so as to extend to the upper surface of the side wall 114. Other structures of the trench gate type power MOSFET 7 according to this embodiment, especially the structure in the terminating portion Rt are substantially equal to those of the second embodiment.

A manufacturing method of the trench gate type power MOSFET 7 shown in FIG. 11 will be described with reference to FIGS. 12 to 19.

Figure 12:
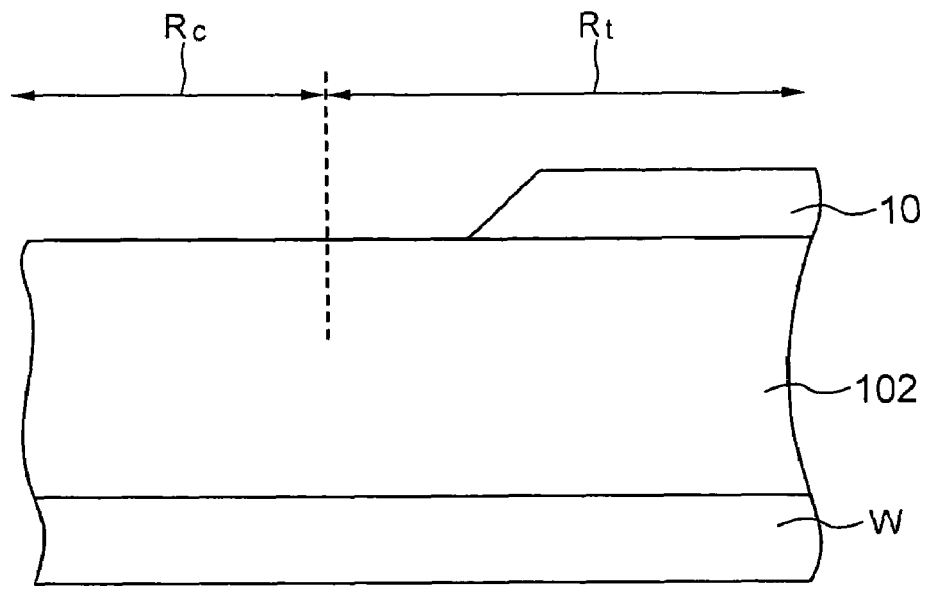
FIGS. 12 through 19 are schematic cross-sectional views showing a manufacturing method of the semiconductor device depicted in FIG. 11.

First, as shown in FIG. 12, the drift layer 102 of the first conductivity type is formed on the semiconductor substrate W to be a drain by epitaxial growth or the like, and the oxide film 10 is formed on the entire upper surface of the drift layer 102 by using the thermal oxidation technique or the like. Then, the cell portion Rc and a part of the terminating portion Rt of the MOSFET are selectively etched and removed by using the photolithography technique or the like.

Figure 13:
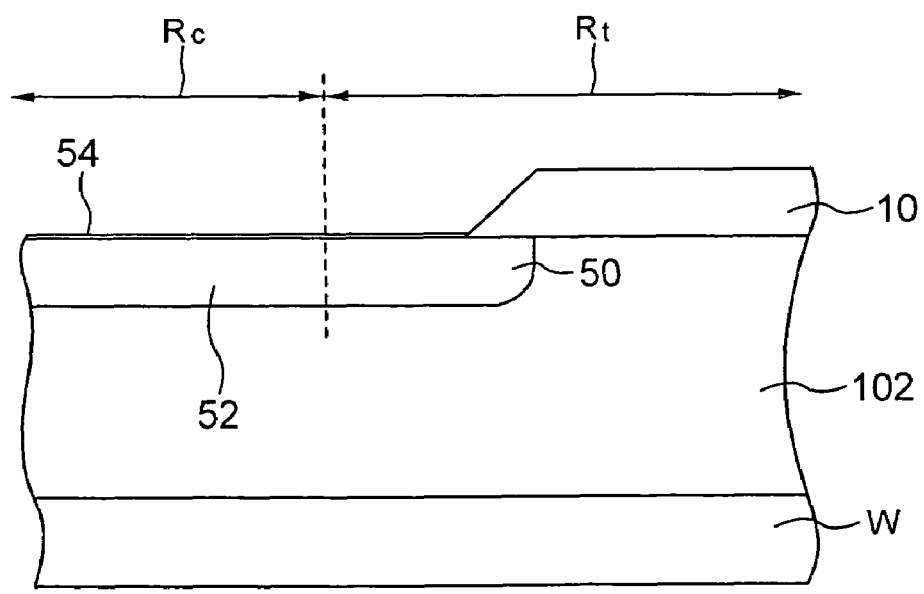

Then, the thin oxide film 54 is formed on the surface of the drift layer 102 by using a thermal oxidation technique or the like, the second conductivity type impurity ions are implanted into the drift layer 102 through the thin oxide film 54 using the oxide film 10 on the drift layer 102 as a mask, and thereafter the cell portion base layer 52 and the terminating portion base layer 50 are simultaneously formed by the thermodiffusion processing or the like as shown in FIG. 13.

Figure 14:
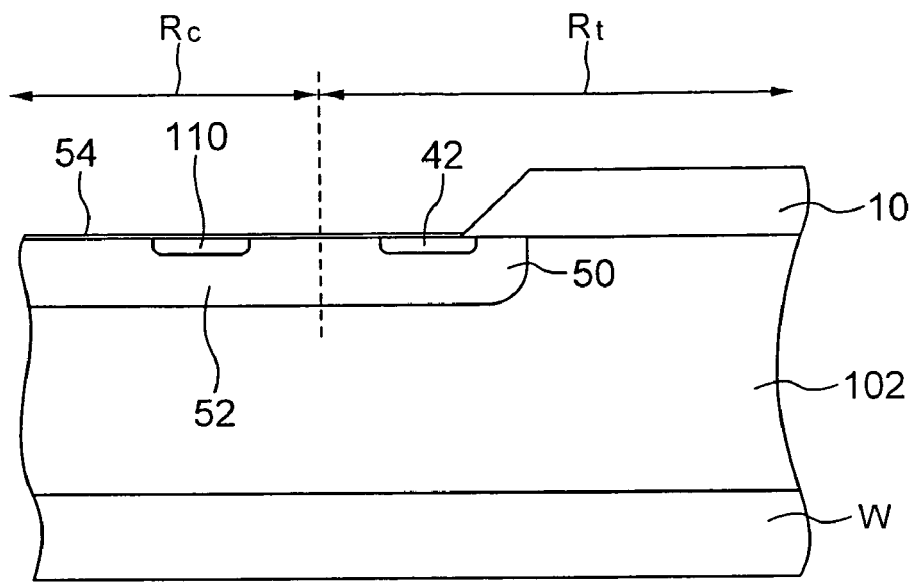
Figure 15:
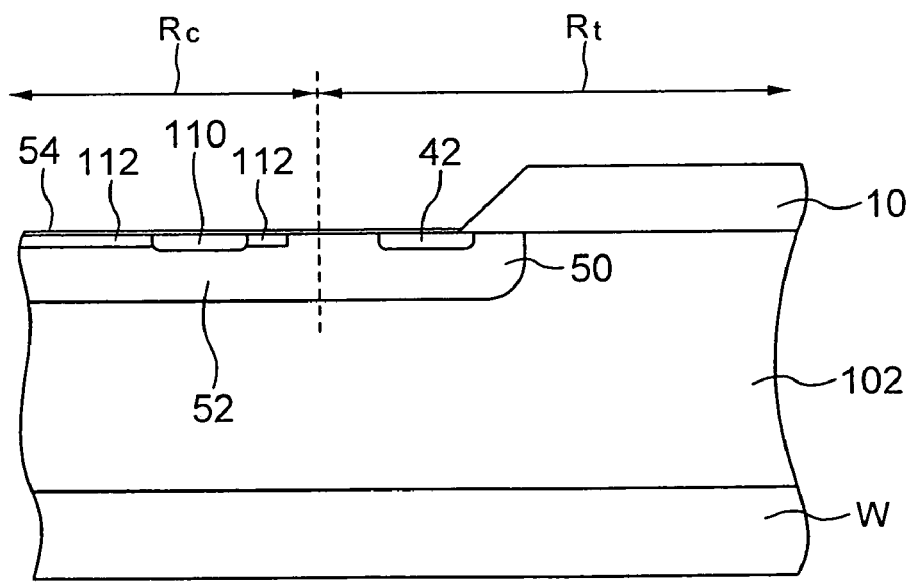

Subsequently, as shown in FIG. 14, the high-concentration impurity diffused layers 110 and 42 of the second conductivity type are selectively formed in the cell portion base layer 52 and in the terminating portion base layer 50, respectively, by the photolithography technique, the impurity ion implantation, the thermodiffusion processing and the like. At this step, a mask for the terminating portion high-concentration impurity diffused layer 42 is formed so as to be positioned on the outer side away from an area in which the side wall spacer 16 (see FIG. 11) is to be formed. Additionally, as shown in FIG. 15, the source layer 112 is selectively formed on the surface layer of the cell portion base layer 52 by using a known technique.

Figure 16:
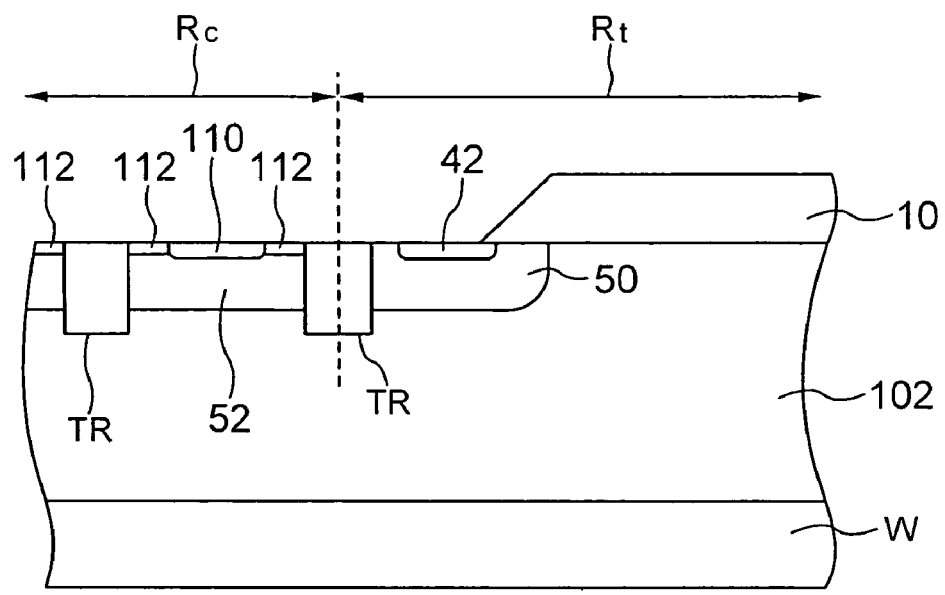
Figure 17:
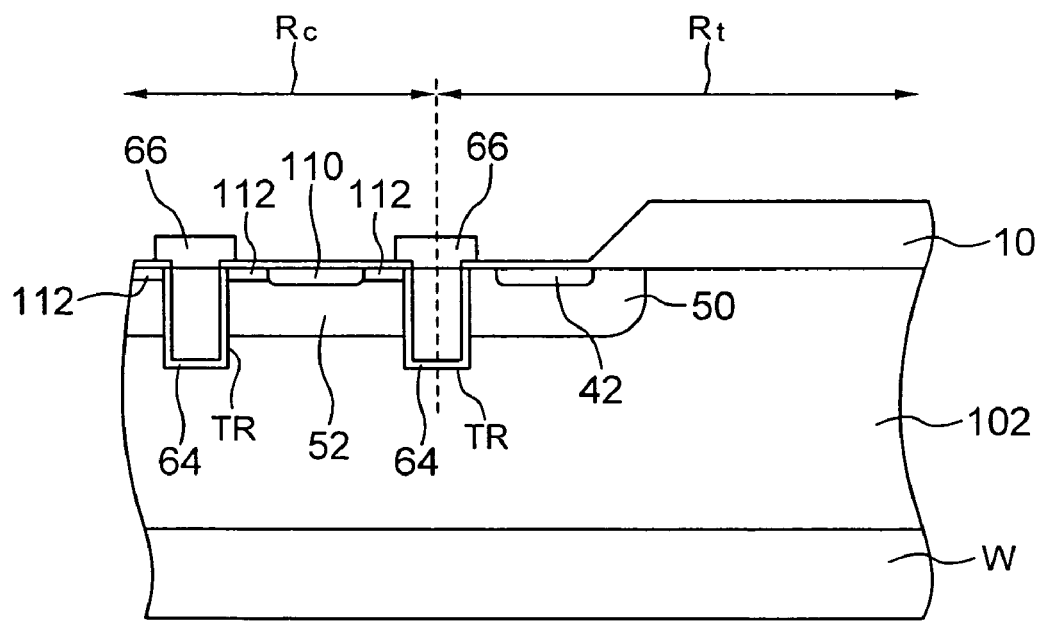

Then, as shown in FIG. 16, a trench TR for a gate area is formed by a known trench technique. Thereafter, the gate oxide film 64 is formed by using the thermal oxidation technique or the like, a trench within the gate oxide film 64 is filled with polysilicon for the gate electrode by polysilicon growth using the CVD technique or the like, the impurity ions are introduced into this polysilicon, and thereafter the gate electrode 66 is formed by desired patterning as shown in FIG. 17.

Figure 18:
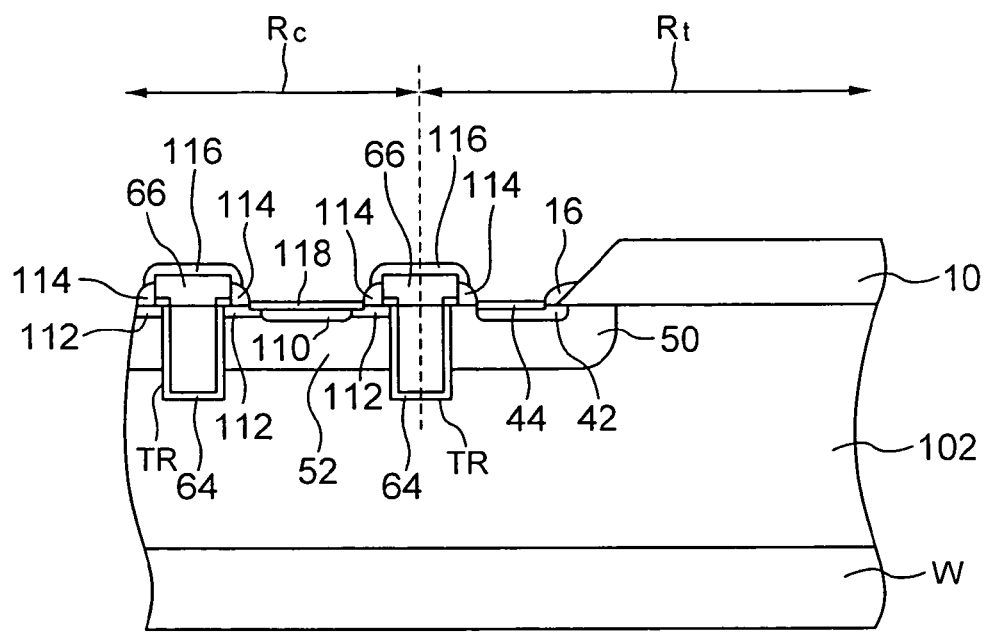
Figure 19:
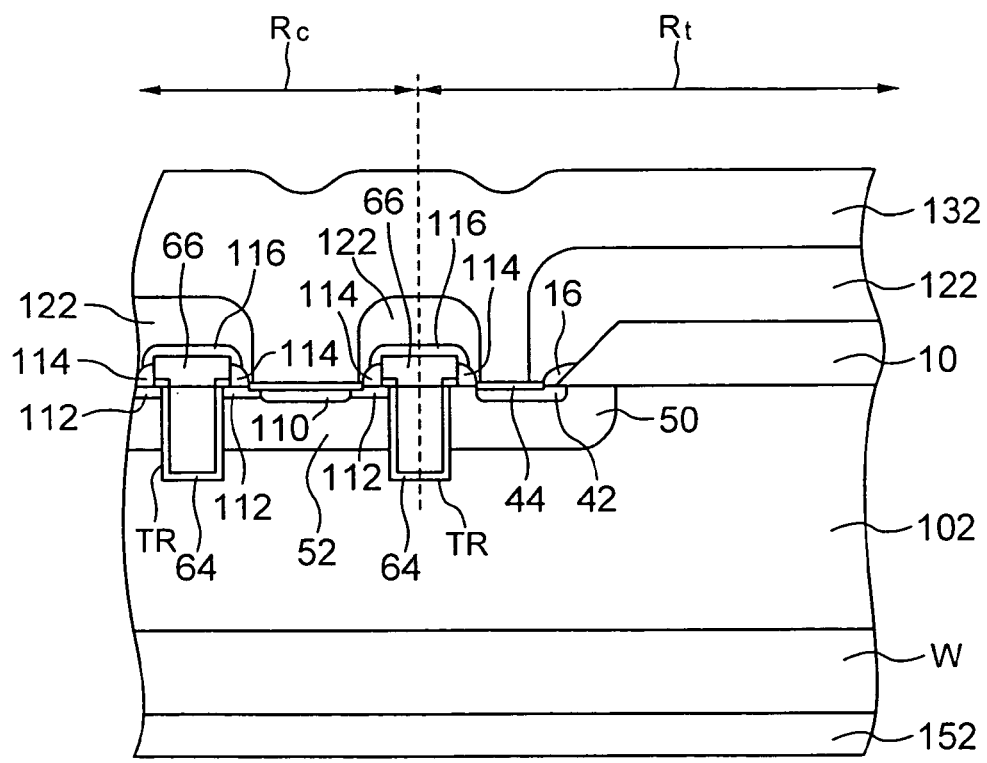

Subsequently, after depositing the insulating film on the entire surface by using a CVD technique or the like, the side wall spacers 114 and 16 are formed utilizing a step between the gate electrode 66 and the substrate surface by an isotropic etching. Then, the high-melting point metal such as titanium (Ti) is deposited on the surface by a sputtering technique or the like, and is caused to react with the gate electrode polysilicon 66 and the substrate surface silicon by the heat treatment, and then the metal silicide layers 116, 118 and 44 are formed as shown in FIG. 18. The metal which does not react with silicon is selectively removed by subsequent etching. Then, as shown in FIG. 19, the interlayer insulating film 122 which insulates the gate and the source from each other is formed by a CVD technique or the like, this insulating film is selectively removed by etching utilizing a photolithography technique or the like, and contact holes for the source electrodes are formed. Then, a metal having, e.g., aluminium (Al) as a main component is deposited by as puttering technique or the like, it is selectively eliminated by etching using a photolithography technique or the like, and the gate electrode 66 and the source electrode 132 are lead out to the outside (not shown). At last, the drain electrode 152 is formed on the lower side of the semiconductor substrate W.

With the above-described steps, the power MOSFET 7 can be manufactured as the fourth embodiment of the semiconductor device according to the present invention. Since the power MOSFET 7 thus formed comprises the terminating portion in which the high-concentration impurity layer 42 has_a part extending from the outer side of the metal silicide layer 44 toward the outer side of the terminating portion base layer 50, the high reliability can be assured even if a high breakdown voltage is used like the above-described planar type power MOSFETs.

Figure 20:
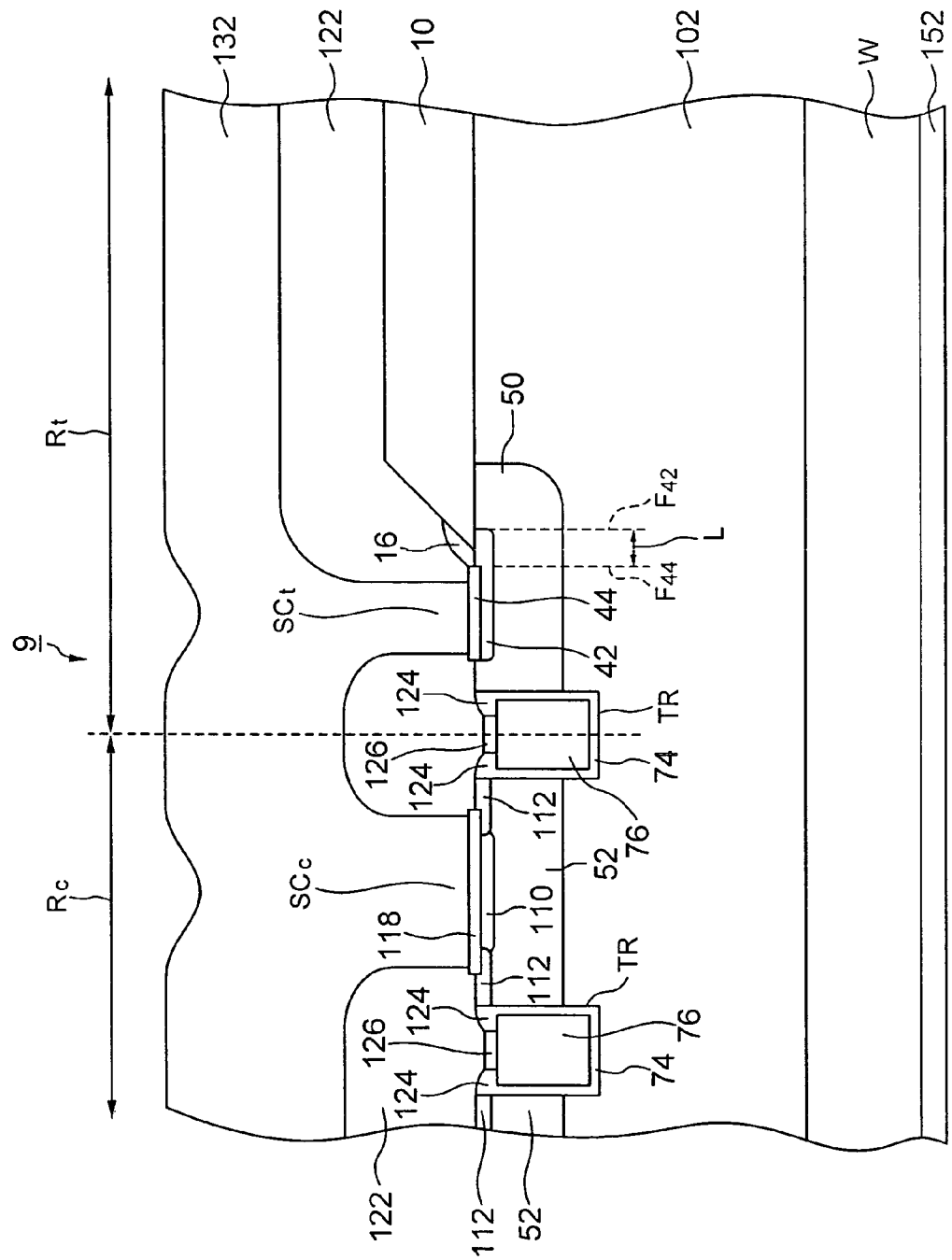
FIG. 20 is a schematic cross-sectional view showing a modification of the fourth embodiment of the semiconductor device according to the present invention.
Figure 21:
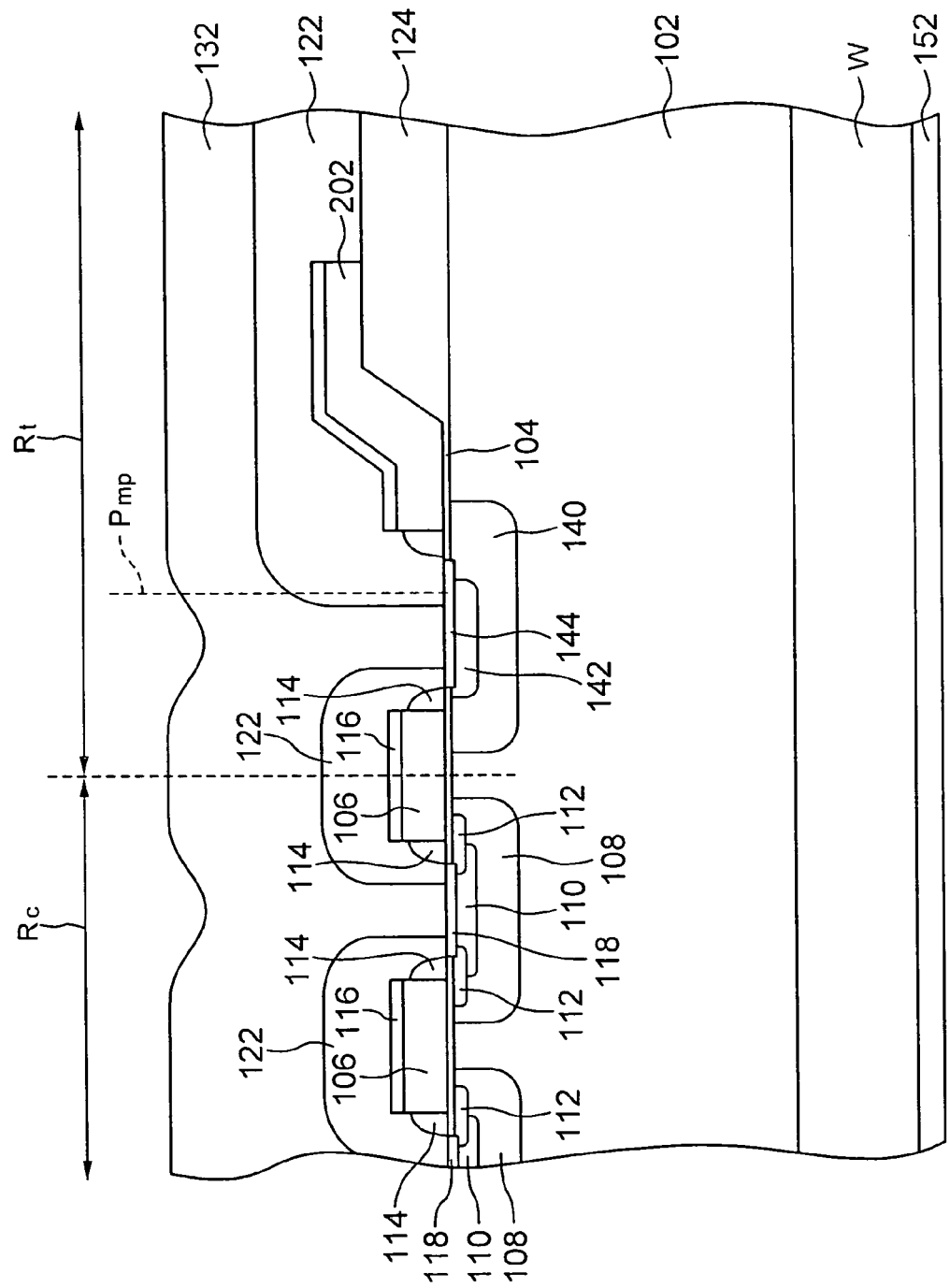
FIG. 21 is a cross-sectional view showing an example of a MOSFET according to a related art.
Figure 22:
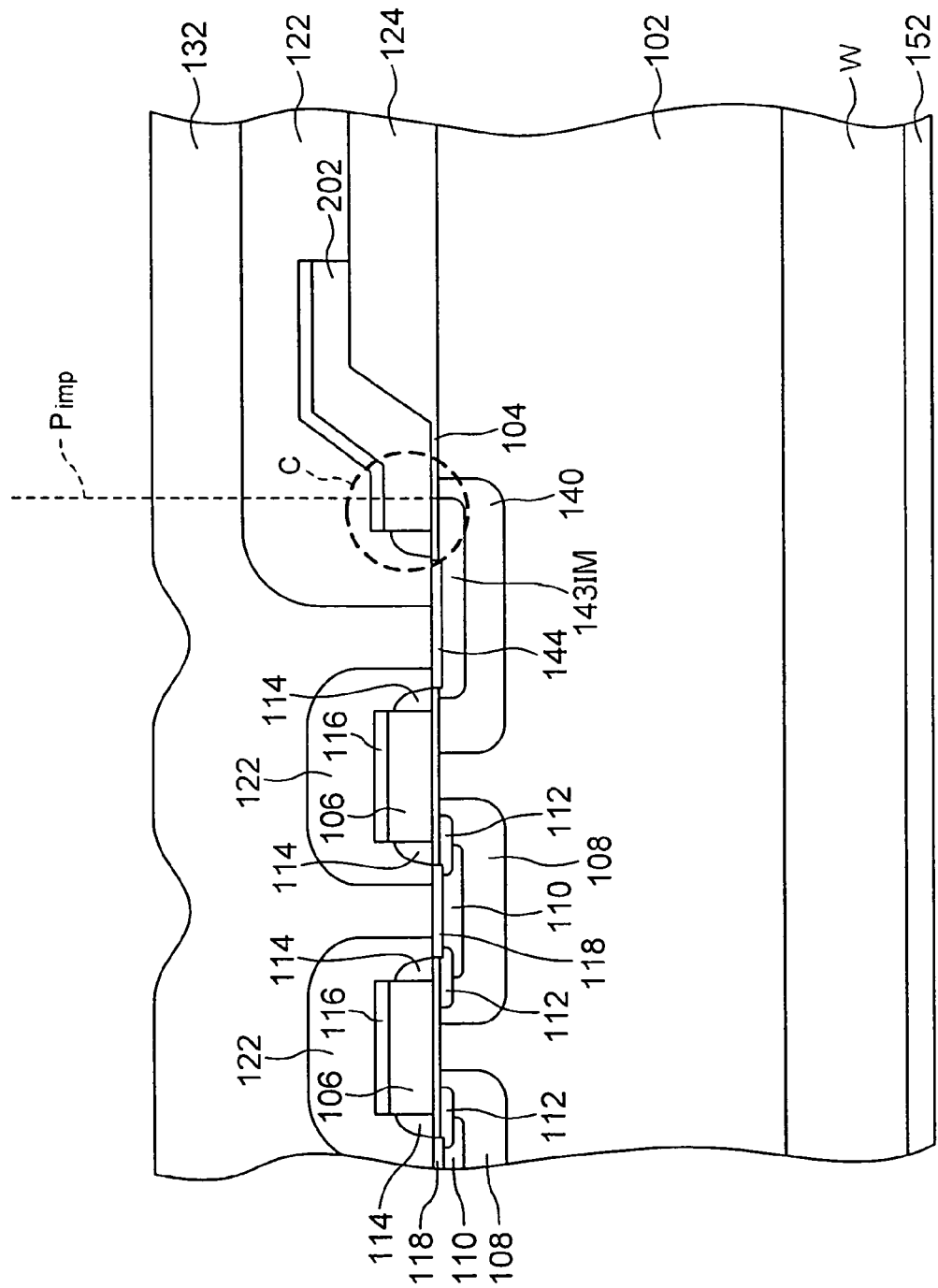
FIG. 22 is a view illustrating a problem of the MOSFET according to the related art.

Although description has been given as to the case that there is provided a structure that the top face of the gate polysilicon electrode 66 protrudes beyond the substrate surface in the fourth embodiment, the present invention is not restricted to the trench gate type having such a shape, and it is possible to apply a structure that the top face of the gate polysilicon electrode is lower than the substrate surface on the contrary. FIG. 20 is a schematic cross-sectional view showing a modification of the fourth embodiment. In the trench gate type power MOSFET 9 shown in the drawing, the gate electrode 76 is formed so as to be accommodated in the gate insulating film 74 formed on the bottom surface and the side surface of the trench TR and its top face is lower than the surface of the source layer 112. In this example, the side wall spacer 124 is formed in corners at which the top face of the gate electrode 76 and the side surfaces of the gate insulating film 74 in the trench TR intersects, and the metal silicide layer 126 is formed on the top face of the gate electrode 76 so as to be sandwiched by this side wall spacer 124. As described above, since the trench gate type power MOSFET 9 has the terminating portion having substantially the same structure as that in the second embodiment even though the gate electrode 76 is formed in the trench TR in such a manner that the top face thereof forms a concave step relative to the substrate surface, the high reliability can be assured even if a high breakdown voltage is used.

An example of a manufacturing method of the power MOSFET 9 shown in FIG. 20 will be briefly explained. First, by using, e.g., steps shown in FIGS. 12 to 14, the cell portion base layer 52 and the terminating portion base layer 50 are simultaneously formed, and the high-concentration impurity diffused layers 110 and 42 of the second conductivity type are selectively formed in these base layers. Thereafter, the trench TR is formed, the gate oxide film 74 is formed, the trench in the gate oxide film 74 is filled with polysilicon and the gate electrode 76 is then formed by etching. Subsequently, the insulating film is deposited on the substrate surface, and then the side wall spacer 124 is formed utilizing a step between the substrate surface and the top face of the gate electrode 76 in the trench TR by an isotropic etching. Then, the source layer 112 is formed in an area in the vicinity of the gate oxide film 74 in the cell portion base layer 52 by implantation of impurity ion, the heat treatment and so on. Thereafter, a high-melting point metal such as titanium (Ti) is deposited on the surface by a sputtering technique, and the high-melting point metal is caused to react with the gate polysilicon electrode 76 and the substrate surface silicon by the heat treatment, thereby the metal silicide layers 126, 118 and 44 are formed. The metal which does not react with silicon is selectively removed by subsequent etching. Thereafter, like the manufacturing method described in connection with the first embodiment, the interlayer insulating film 122 is formed, and then the source electrode 132 and the drain electrode 152 are formed.

While the embodiments of the present invention have been described, the present invention should not be limited to the above described embodiments, but the invention can be embodied in various ways without departing from its scope and spirit.

What is claimed is:
1. A semiconductor device comprising:
a semiconductor substrate of a first conductivity type;
a drift layer of a first conductivity type formed on a first main surface of the semiconductor substrate, a surface of the drift layer having a first area and a second area which is positioned on an outer periphery of the first area;
a cell portion which is formed in the first area of the drift layer and includes a first base layer of a second conductivity type selectively formed in a surface layer of the first area, a source layer of a first conductivity type selectively formed in a surface layer of the first base layer, a first metallic compound which is formed on the surface layer of the first base layer and a surface layer of the source layer in common, and a control electrode which is formed in the first base layer and the source layer via a first insulating film and has a second metallic compound formed on a top surface thereof;
a terminating portion which is formed in the second area of the drift layer, alleviates an electric field to maintain a breakdown voltage by extending a depletion layer, and includes a second base layer of a second conductivity type selectively formed in a surface layer in the second area of the drift layer, an impurity diffused layer of a second conductivity type formed in a surface layer of the second base layer, and a third metallic compound which is provided to a surface layer of the impurity diffused layer, an end surface thereof on the terminating portion side being positioned on the cell portion side away from an end surface of the impurity diffused layer on the terminating portion side;
a first main electrode formed so as to be in contact with the first metallic compound and the third metallic compound in common; and
a second main electrode formed on a second main surface opposite to the first main surface of the semiconductor substrate.

2. The semiconductor device according to claim 1, further comprising a second insulating film which is formed in the second area of the drift layer and on a further peripheral area surface of the terminating portion side end surface of the third metallic compound,
wherein the impurity diffused layer is formed in a self-alignment manner with respect to an end portion of the second insulating film on the cell portion side.

3. The semiconductor device according to claim 2, wherein the second insulating film is formed thicker than the first insulating film.

4. The semiconductor device according to claim 1, further comprising a second insulating film which is formed thicker than the first insulating film in the second area of the drift layer and outside of the third metallic compound,
wherein the impurity diffused layer is formed in a self-alignment manner with respect to an end portion of the second insulating film on the cell portion side.

5. The semiconductor device according to claim 1, wherein the second insulating film has a first side wall spacer formed on an end surface thereof on the cell portion side, and
the third metallic compound is formed in a self-alignment manner with respect to the first wall spacer.

6. The semiconductor device according to claim 1, further comprising a third insulting film which is formed on a surface of an end portion of the impurity diffused layer on the terminating portion side and has a thickness which allows passage of a second conductivity type impurity to form the impurity diffused layer.

7. The semiconductor device according to claim 1, wherein the control electrode is formed so as to have a stripe planar shape, and a distance between an end surface of the third metallic compound on the terminating portion side and an end surface of the impurity diffused layer on the terminating portion side is assured by a diffusion depth of the impurity diffused layer in a direction orthogonal to a longitudinal direction of the stripe of the control electrode and a width of the first side wall spacer.

8. The semiconductor device according to claim 1, wherein a distance between the end surface of the third metallic compound on the terminating portion side and an end surface of the impurity diffused layer on the terminating portion side is equal to or more than 0.2 $\mu$m.

9. The semiconductor device according to claim 1, further comprising a second side wall spacer provided on a side surface of the control electrode,
wherein the first metallic compound and the second metallic compound are insulated from each other by the second side wall spacer.

10. The semiconductor device according to claim 9, wherein the second metallic compound is extended onto the second side wall spacer.

11. The semiconductor device according to claim 1, further comprising a fourth metallic compound formed on a top face of the field plate electrode.

12. The semiconductor device according to claim 2, wherein to the field plate electrode is applied substantially the same potential as that of the first main electrode or the control electrode.

13. A semiconductor device comprising:
a semiconductor substrate of a first conductivity type;
a drift layer of a first conductivity type formed on a first main surface of the semiconductor substrate and has a first area and a second area which is positioned on an outer periphery of the first area;
a cell portion which is formed in the first area of the drift layer, and includes a first base layer of a second conductivity type selectively formed in a surface layer of the first area, a trench formed so as to extend from a surface of the first base layer to the inside of the drift layer, a first insulating film formed on a bottom surface and side surfaces of the trench, a source layer of a first conductivity type selectively formed in a surface layer of the first base layer so as to be in contact with the first insulating film, a first metallic compound formed on a surface of the first base layer and a surface of the source layer in common, and a control electrode which is formed so as to fill the trench via the first insulating film and has a second metallic compound formed on a top face thereof;
a terminating portion which is formed in the second area of the drift layer and alleviates an electric field to maintain a breakdown voltage by extending a depletion layer, and includes a second base layer of a second conductivity type selectively formed in a surface layer in the second area of the drift layer, an impurity diffused layer of a second conductivity type formed in a surface layer of the second base layer, and a third metallic compound which is formed in a surface layer in the impurity diffused layer, an end surface thereof on the terminating portion side being positioned on the cell portion side away from an end surface of the impurity diffused layer on the terminating portion side;
a first main electrode formed so as to be in contact with the first metallic compound and the third metallic compound in common; and
a second main electrode formed on a second main surface opposite to the first main surface of the semiconductor substrate.

14. The semiconductor device according to claim 13, further comprising a second insulating film which is formed in the second area of the drift layer and on a further peripheral area surface of the terminating portion side end surface of the third metallic compound,
wherein the impurity diffused layer is formed in a self-alignment manner with respect to an end portion of the second insulating film on the cell portion side.

15. The semiconductor device according to claim 14, wherein the second insulating film is formed thicker than the first insulating film.

16. The semiconductor device according to claim 13, further comprising a second insulating film which is formed thicker than the first insulating film in the second area of the drift layer and outside of the third metallic compound,
wherein the impurity diffused layer is formed in a self-alignment manner with respect to an end portion of the second insulating film on the cell portion side.

17. The semiconductor device according to claim 13, wherein the second insulating film has a first side wall spacer formed on an end surface thereof on the cell portion side, and
the third metallic compound is formed in a self-alignment manner with respect to the first wall spacer.

18. The semiconductor device according to claim 13, further comprising a third insulting film which is formed on a surface of an end portion of the impurity diffused layer on the terminating portion side and has a thickness which allows passage of a second conductivity type impurity to form the impurity diffused layer.

19. The semiconductor device according to claim 13, wherein the control electrode is formed so as to have a stripe planar shape, and
a distance between an end surface of the third metallic compound on the terminating portion side and an end surface of the impurity diffused layer on the terminating portion side is assured by a diffusion depth of the impurity diffused layer in a direction orthogonal to a longitudinal direction of the stripe of the control electrode and a width of the first side wall spacer.

20. The semiconductor device according to claim 13, wherein a distance between the end surface of the third metallic compound on the terminating portion side and an end surface of the impurity diffused layer on the terminating portion side is equal to or more than 0.2 $\mu$m.

21. The semiconductor device according to claim 13, further comprising a second side wall spacer provided on a side surface of the control electrode,
wherein the first metallic compound and the second metallic compound are insulated from each other by the second side wall spacer.

22. The semiconductor device according to claim 21, wherein the second metallic compound is extended onto the second side wall spacer.

23. The semiconductor device according to claim 13, further comprising a fourth metallic compound formed on a top face of the field plate electrode.

24. The semiconductor device according to claim 14, wherein to the field plate electrode is applied substantially the same potential as that of the first main electrode or the control electrode.

* * * * *